(12) United States Patent
Suh et al.

(10) Patent No.: US 8,421,337 B2
(45) Date of Patent: Apr. 16, 2013

(54) ORGANIC LIGHT EMITTING DIODE DISPLAY DEVICE AND METHOD OF FABRICATING THE SAME

(75) Inventors: Min-Chul Suh, Suwon-si (KR); Seong-Taek Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 394 days.

(21) Appl. No.: 12/357,338

(22) Filed: Jan. 21, 2009

(65) Prior Publication Data

US 2009/0236977 A1 Sep. 24, 2009

(30) Foreign Application Priority Data

Mar. 18, 2008 (KR) .................. 10-2008-0024910

(51) Int. Cl.
*H05B 33/26* (2006.01)

(52) U.S. Cl.
USPC .......................................... 313/504; 313/509

(58) Field of Classification Search .......... 313/498–512; 315/169.3; 345/36, 45, 76
See application file for complete search history.

(56) References Cited

U.S. PATENT DOCUMENTS

| | | | |
|---|---|---|---|
| 5,998,085 A | 12/1999 | Isberg et al. | |
| 7,494,923 B2 * | 2/2009 | Yamamoto et al. | 438/662 |
| 2002/0142697 A1 * | 10/2002 | Yamagata et al. | 445/24 |
| 2003/0047730 A1 * | 3/2003 | Konuma | 257/42 |
| 2003/0129297 A1 * | 7/2003 | Jakobi et al. | 427/66 |
| 2004/0106718 A1 * | 6/2004 | Krohn | 524/444 |
| 2004/0256980 A1 * | 12/2004 | Tsuchiya | 313/503 |
| 2005/0095356 A1 * | 5/2005 | Nakamura et al. | 427/58 |

FOREIGN PATENT DOCUMENTS

| | | |
|---|---|---|
| JP | 2002-216957 | 8/2002 |
| KR | 10-0282346 | 2/2001 |
| KR | 10-0358501 | 10/2002 |
| KR | 10-0359906 | 10/2002 |
| KR | 2004-0103062 | 12/2004 |
| KR | 10-2005-0110550 | 11/2005 |
| KR | 10-0579174 | 5/2006 |

OTHER PUBLICATIONS

Korean Patent Abstracts, Publication No. 1020020037531, dated May 22, 2002, corresponding to Korean patent 10-0359906 listed above.
Korean Notice of Allowance dated Oct. 31, 2009, for priority Korean application 10-2008-0024910, noting listed references in this IDS.
Kuwahara, Masashi, "Thermal Lithography for 100 nm Fabrication Pattern", AIST Today Intl. Ed. No. 3, p. 17.

* cited by examiner

*Primary Examiner* — Nimeshkumar Patel
*Assistant Examiner* — Christopher Raabe
(74) *Attorney, Agent, or Firm* — Christie, Parker & Hale, LLP

(57) ABSTRACT

An organic light emitting diode (OLED) display device and a method of fabricating the same. The OLED display device includes a substrate, a thin film transistor on the substrate and including a semiconductor layer, a gate electrode, a gate insulating layer, a source electrode and a drain electrode. A passivation layer is on an entire surface of the substrate including the thin film transistor. A planarization layer is on the passivation layer. A first electrode is on the planarization layer and electrically coupled to any one of the source electrode or the drain electrode. A metal mixture layer is on substantially the entire surface of the substrate and includes a conductive region and a non-conductive region. An organic emitting layer and a second electrode both are on the metal mixture layer.

7 Claims, 2 Drawing Sheets

ORGANIC LIGHT EMITTING DIODE DISPLAY DEVICE AND METHOD OF FABRICATING THE SAME

CROSS-REFERENCE TO RELATED APPLICATION

This application claims priority to and the benefit of Korean Patent Application No. 2008-24910, filed on Mar. 18, 2008, the entire content of which is hereby incorporated herein by reference in its entirety.

BACKGROUND OF THE INVENTION

1. Field of the Invention

The present invention relates to an organic light emitting diode (OLED) display device and a method of fabricating the same.

2. Description of the Related Art

Among flat panel display devices, because an OLED display device has a fast response time (e.g., 1 ms or less), a low power consumption, a self-emission characteristic and a wide viewing angle, it can be utilized as a moving picture display medium regardless of the size of the device. Further, the OLED display device can be fabricated at a low temperature by a simple process based on conventional semiconductor processing technology, so that it has attracted attention as a next generation flat panel display device.

An OLED display device may include a polymer device formed by a wet etching process or a small molecular device formed by a deposition process according to the material and process used to manufacture an organic light emitting diode.

An inkjet printing method for patterning a polymer or small molecular emitting layer has disadvantages in that materials suitable for forming organic layers, other than the emitting layer, are limited, and a structure for inkjet printing should be formed on a substrate. A deposition method for patterning an emitting layer is difficult to be applied in the formation of a large-sized device due to the use of a metal mask.

Laser induced thermal imaging (LITI) has been recently developed as an alternative to the above-described patterning methods.

LITI is a method which converts laser emitted from a light source into heat energy and forms a pattern using the heat energy. For this method, a donor substrate having a transfer layer, a light source, and another substrate as an object of the deposition are required.

According to a conventional method of fabricating an OLED display device, when a transfer layer is transferred onto a substrate having a pixel defining layer using LITI, the transfer layer cannot uniformly cover an edge of the substrate, because of a step difference between the pixel defining layer and the substrate. Thus, after a patterning process, an edge-open region is formed in a region which does not have the transfer layer, so that a patterning defect is generated at a boundary region of a pixel portion.

SUMMARY OF THE INVENTION

Embodiments of the present invention provide an OLED display device and a method of fabricating the same capable of improving performance in the transfer of an organic emitting layer and reducing an edge open defect due to a level difference (or a step) between a pixel defining layer and a first electrode in an emitting region.

According to an embodiment of the present invention, an OLED display device includes: a substrate; a thin film transistor on the substrate and including a semiconductor layer, a gate electrode, a gate insulating layer, a source electrode and a drain electrode; a passivation layer on substantially an entire surface of the substrate including the thin film transistor; a planarization layer on the passivation layer; a first electrode on the planarization layer and electrically coupled to at least one of the source electrode and the drain electrode; a metal mixture layer on substantially the entire surface of the substrate and including a conductive region and a non-conductive region; and an organic emitting layer and a second electrode both on the metal mixture layer.

According to another embodiment of the present invention, a method of fabricating an OLED display device includes: preparing a substrate; forming a buffer layer on the substrate; forming a semiconductor layer on the buffer layer; forming a gate insulating layer on the semiconductor layer; forming a gate electrode on the gate insulating layer; forming an interlayer insulating layer on substantially an entire surface of the substrate; forming a source electrode and a drain electrode on the interlayer insulating layer to be connected to the semiconductor layer; forming a passivation layer on substantially the entire surface of the substrate; forming a planarization layer on the passivation layer; forming a first electrode on the planarization layer to be electrically coupled to at least one of the source electrode and the drain electrode; forming a metal mixture layer on substantially the entire surface of the substrate including the first electrode; forming a conductive region and a non-conductive region by sintering a portion of the metal mixture layer by laser irradiation; forming an organic emitting layer on the substrate; and forming a second electrode on the organic emitting layer.

Additional aspects and/or features of the present invention are set forth in part in the description which follows and, in part, may be derived from the description, or may be learned by practice of the present invention.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1A:
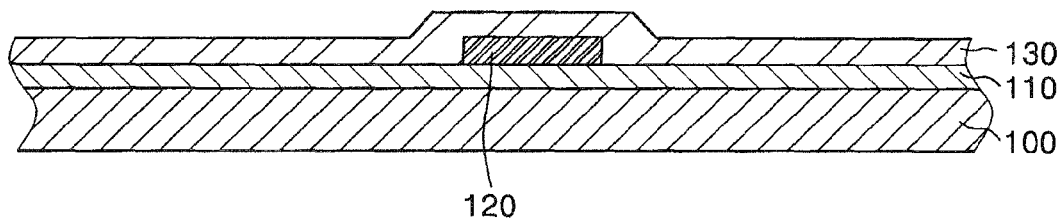
FIGS. 1A to 1E are cross-sectional schematic views of an OLED display device according to an exemplary embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIGS. 1A to 1E are cross-sectional schematic views of an OLED display device according to an exemplary embodiment of the present invention.

Referring to FIG. 1A, a buffer layer 110 is formed on a substrate 100. The buffer layer 110 may be formed of silicon oxide, silicon nitride, or combinations thereof.

Then, a semiconductor layer 120 formed of polycrystalline silicon is formed on the buffer layer 110, and a gate insulating layer 130 is formed on the entire surface of the substrate 100 having the semiconductor layer 120.

Figure 1B:
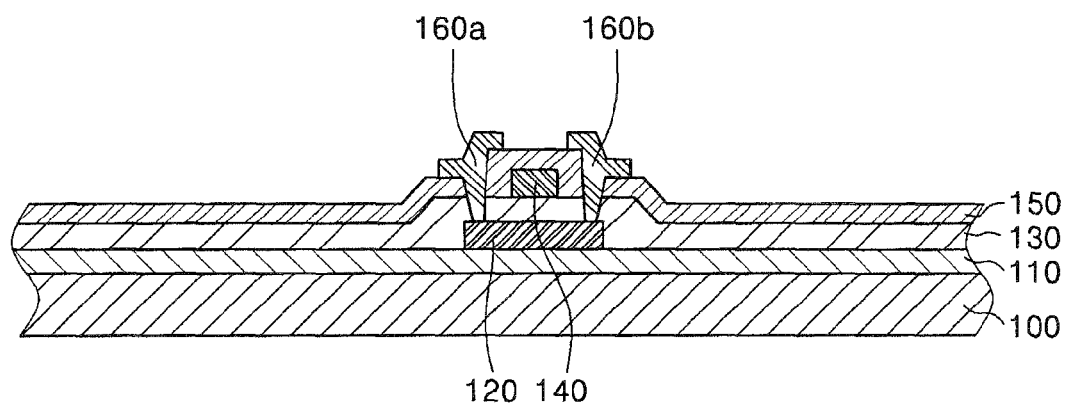

Referring to FIG. 1B, a gate electrode 140, an interlayer insulating layer 150, and source and drain electrodes 160a and 160b are formed on the gate insulating layer 130, so that a thin film transistor is formed.

The gate electrode 140 may be formed of aluminum (Al), an Al alloy, molybdenum (Mo), a Mo alloy, and/or a MoW alloy. In one embodiment, the gate electrode 140 is formed of a MoW alloy.

The gate insulating layer 130 and the interlayer insulating layer 150 may be formed of silicon nitride, silicon oxide or combinations thereof.

Thus, the thin film transistor is completed.

Figure 1C:
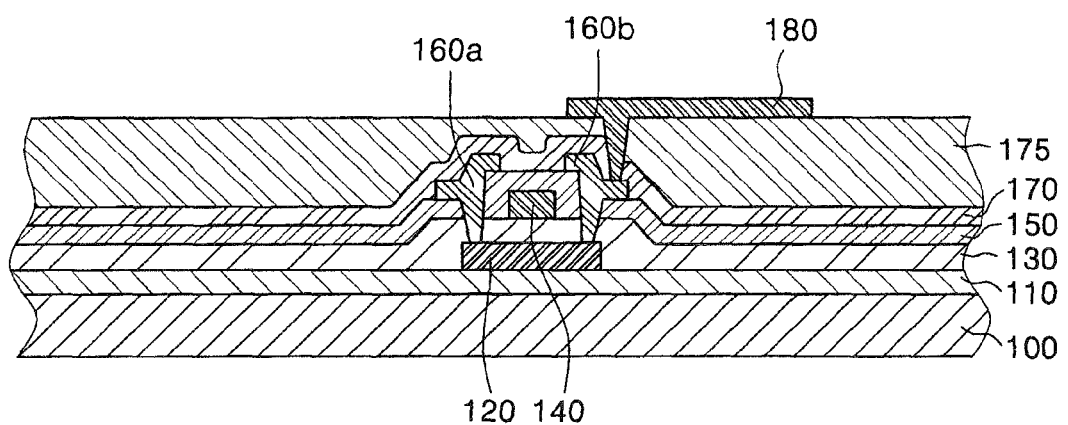

Subsequently, referring to FIG. 1C, a passivation layer 170 and a planarization layer 175 are formed on the entire surface of the substrate, and a first electrode 180 is formed to be connected to any one of the source and drain electrodes 160a and 160b through a via hole (not illustrated). Here, the first electrode 180 may be formed of ITO, IZO and/or ITZO.

Figure 1D:
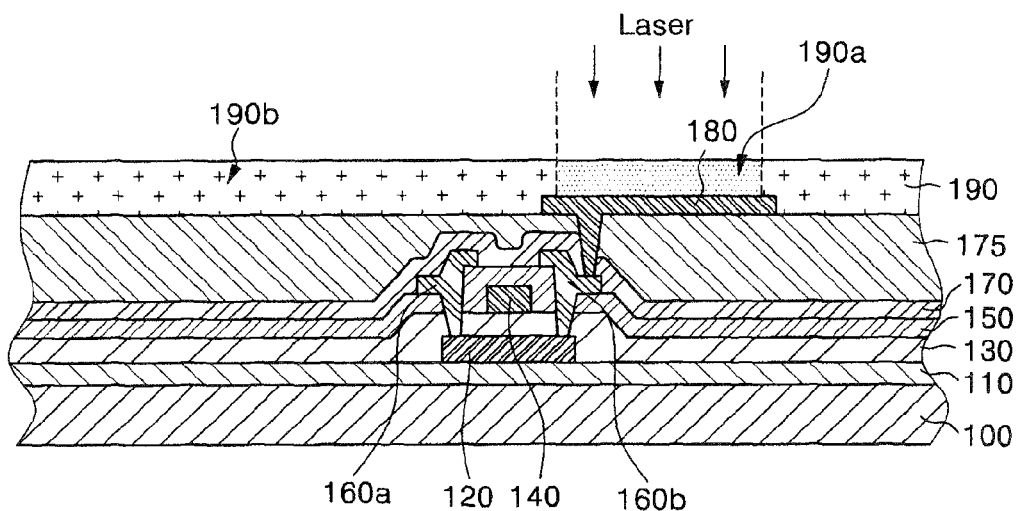

Referring to FIG. 1D, a metal mixture layer 190 formed of metal nanoparticles and an organic layer is formed on the substrate having the first electrode 180. Here, the metal nanoparticles may be Au, Ag and/or Ni nanoparticles, and the organic layer is formed of a photoresist material. Here, the organic layer and the metal nanoparticles may be mixed in a ratio of 1:1 to 99:1. Thus, the organic layer can serve as a pixel defining layer having insulating characteristics in a non-conductive region even when the organic layer is mixed with the metal nanoparticles, and the organic layer is carbonated into carbon black by laser, so that it can have conductivity along with the metal nanoparticles in a conductive region.

The metal mixture layer 190 is present in a suspension state which is melted in a liquid solvent. The metal nanoparticles are coated with one or more thin polymer layers, and isolated from one another. The one or more polymer layers serve to prevent (or protect from) interaction between the metal nanoparticles and maintain the metal mixture layer 190 in a suspension state.

The organic layer material is a photoresist material, which may be a polyphenoxide- or polyphenol-based material having many benzene rings for effective carbonization, for example, a polymer material such as PEDOT or PANI.

The metal mixture layer 190 may be formed on the first electrode 180 by inkjet printing, spin coating or LITI.

The metal mixture layer 190 formed on the first electrode 180 is sintered by laser irradiation. Here, a laser-irradiated portion becomes a conductive region 190a, and a non-laser-irradiated portion becomes a non-conductive region 190b. Here, the conductive region 190a is formed on the first electrode 180.

For example, when the metal mixture layer 190 is sintered by IR laser, the organic layer is carbonated into carbon black, which corresponds to black-color fine carbon powder, i.e., soot. The carbon black has a conductivity that is useful in such devices as an electrode of batteries. An interconnection formed by a fusion of the metal nanoparticle and the carbon black can prevent (or protect from) detachment of a metallic material from the substrate due to cohesion between the substrate and the metallic molecules.

A carbonization degree of the organic layer depends on the material of the organic layer, which may be carbonized using IR laser with a minimum intensity of 1 J/cm$^2$ or more. The carbonization degree of the organic layer may be adjusted, thereby selectively forming carbon black with low electrical resistance and improving the characteristics of the device. The IR laser oscillates with a wavelength of 0.8 to 1000 μm, and has single color and high intensity. For example, the IR laser may be a 0.9 μm gallium-arsenic semiconductor laser, a 1.06 μm glass and YAG laser, 1.15 μm and 3.39 μm helium-neon lasers, a 10.6 μm carbon dioxide laser, and/or a 337 μm cyanogen laser. However, the present invention is not limited to these exemplary lasers.

Thus, the conductive region 190a, the laser-irradiated portion of the metal mixture layer 190, becomes conductive by fusing the carbon black and metal nanoparticle, and the non-laser-irradiated portion becomes a non-conductive region 190b due to insulating characteristics of the organic layer. Moreover, a pixel portion (or display region) is defined by the conductive region 190a formed as such and is connected to the first electrode 180. In addition, between the conductive region 190a and the non-conductive region 190b of the metal mixture layer 190, there is no level difference (or a step between them).

Figure 1E:
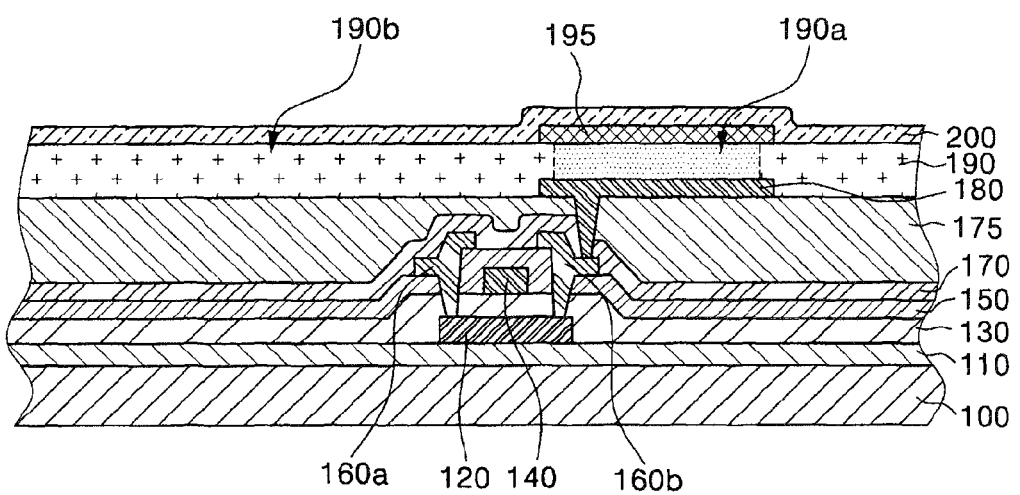

Referring to FIG. 1E, an organic emitting layer 195 is formed on the conductive region 190a of the metal mixture layer 190, and may include a charge injection layer or a charge transport layer thereon or thereunder. Here, the organic emitting layer 195 may be formed by LITI, so that there is no level difference (or a step between them) in the portion where the organic emitting layer 195 is formed, and thus the conventional edge open phenomenon may be solved.

A second electrode 200 is formed on the entire surface of the substrate 100, thereby forming an OLED display device according to the present invention.

The above described exemplary embodiments of the present invention reduce or remove an edge open defect caused by a step difference present in a pixel portion during a conventional LITI process, and provide an OLED display device which can reduce the step difference in the pixel portion, and a method of fabricating the same. Thus, the edge open defects may be significantly reduced, and production yield may be increased by a simple process.

Although certain exemplary embodiments of the present invention have been disclosed for illustrative purposes, those skilled in the art will appreciate that various modifications, additions and substitutions are possible, without departing from the scope and spirit of the present invention as disclosed in the accompanying claims and their equivalents.

What is claimed is:

1. An organic light emitting diode (OLED) display device comprising:
   a substrate;
   a thin film transistor on the substrate and including a semiconductor layer, a gate electrode, a gate insulating layer, a source electrode contacting the semiconductor layer through the gate insulating layer, and a drain electrode contacting a drain region of the semiconductor layer through the gate insulating layer;
   a passivation layer on substantially an entire surface of the substrate including the thin film transistor;
   a planarization layer on the passivation layer;
   a first electrode on the planarization layer and electrically coupled to at least one of the source electrode or the drain electrode;
   a metal mixture layer on substantially the entire surface of the substrate and including a conductive region having an upper surface and a non-conductive region having an upper surface that is level with the upper surface of the conductive region, the conductive region being located on the first electrode and not being in contact with the planarization layer, and the non-conductive region contacting the planarization layer; and an organic emitting layer and a second electrode both on the metal mixture layer.

2. The OLED display device according to claim 1, wherein the conductive region comprises an organic carbide and a metal nanoparticle.

3. The OLED display device according to claim 2, wherein the metal nanoparticle is at least one of an Au nanoparticle, an Ag nanoparticle, or an Ni nanoparticle.

4. The OLED display device according to claim 2, wherein the organic carbide is carbon black.

5. The OLED display device according to claim 1, wherein the non-conductive region comprises an organic layer and a metal nanoparticle.

6. The OLED display device according to claim 5, wherein the metal nanoparticle is at least one of an Au nanoparticle, an Ag nanoparticle, or an Ni nanoparticle.

7. The OLED display device according to claim 5, wherein the organic layer comprises a photoresist material.

\* \* \* \* \*